United States Patent
Robertson

(10) Patent No.: US 7,243,281 B2
(45) Date of Patent: Jul. 10, 2007

(54) SERIAL BURN-IN MONITOR

(75) Inventor: Iain Robertson, Cople (GB)

(73) Assignee: Texas Instruments Incorporated, Dallas, TX (US)

(*) Notice: Subject to any disclaimer, the term of this patent is extended or adjusted under 35 U.S.C. 154(b) by 170 days.

(21) Appl. No.: 11/151,575

(22) Filed: Jun. 13, 2005

(65) Prior Publication Data

US 2005/0289420 A1 Dec. 29, 2005

(30) Foreign Application Priority Data

Jun. 12, 2004 (GB) .................................. 0413140.5

(51) Int. Cl.
*G01R 31/28* (2006.01)

(52) U.S. Cl. .................................................... 714/726

(58) Field of Classification Search ...................... None
See application file for complete search history.

(56) References Cited

U.S. PATENT DOCUMENTS 6,437,590 B1  8/2002  Tatsumi ....................... 324/763
6,885,599 B2 * 4/2005  Saitoh et al. ................ 365/201
2002/0083389 A1  6/2002  Grisenthwaite ............. 714/729
2003/0149913 A1 * 8/2003  Balachandran et al. ....... 714/30
2003/0167429 A1  9/2003  Krause et al. .............. 714/724

* cited by examiner

*Primary Examiner*—Christine T. Tu
(74) *Attorney, Agent, or Firm*—William B. Kempler; W. James Brady, III; Frederick J. Telecky, Jr.

(57) ABSTRACT

There is provided a burn-in monitor for testing modules on an Integrated Circuit (IC), and a corresponding method. The burn-in monitor comprises: a Serial Test and Configuration Interface STCI for controlling and observing modules through a scan chain; a scan-in pin for loading a prepared set of test vectors; and a scan-out pin associated with the STCI for outputting all status bits. A burn-in mode is provided on the STCI and is selectable during testing for configuring the scan chain, such that said scan chain contains only those status bits required for monitoring burn-in, plus a number of bits necessary for controlling overall behaviour of the scan chain whereby the scan elements associated with the control bits will be loaded with zero. Hence the scan-out pin will show a one if there is a fault. Preferably the scan chain contains the minimum number of control bits necessary for controlling overall behaviour of the scan chain.

4 Claims, 1 Drawing Sheet

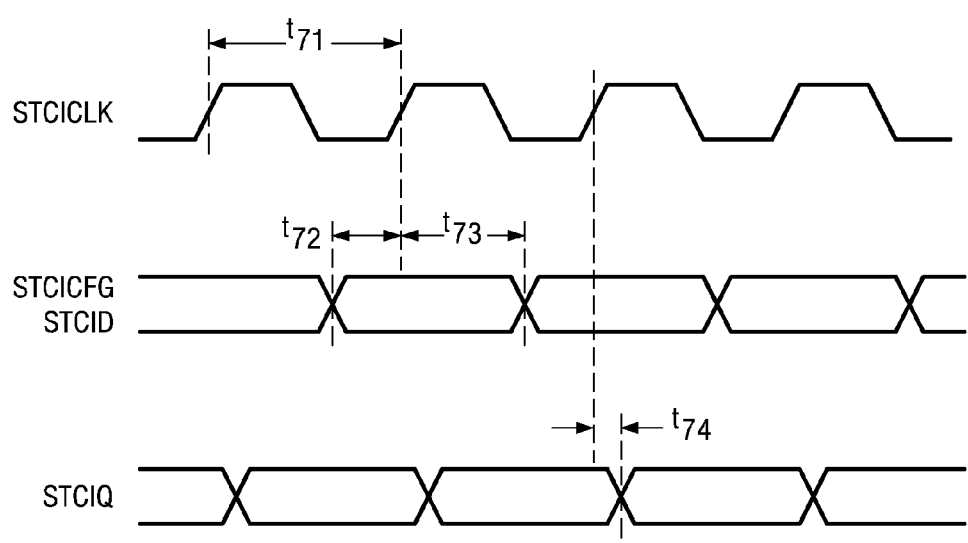

SERIAL BURN-IN MONITOR

FIELD OF THE INVENTION

The present invention relates to burn-in testing of Integrated Circuits, and more particularly, to an improved burn-in monitor for complex modules in Integrated Circuits and a method for monitoring burn-in therefor.

BACKGROUND OF THE INVENTION

During burn-in testing, it is desirable to designate a single chip output for monitoring purposes. When burning in multiple complex Intellectual Property Modules (IP modules), provision of this capability typically requires the construction of an OR tree of the monitor outputs from each module instance. Whilst not difficult, this is an irregular structure, implementation of which requires time and effort that could be better spent elsewhere. Customers are often reluctant to do this, and so monitoring is often not available.

SUMMARY OF THE INVENTION

The present invention provides burn-in monitoring of an arbitrary number of IP modules without the need for additional glue logic.

Accordingly, there is provided a burn-in monitor for testing modules on an Integrated Circuit (IC), comprising: a Serial Test and Configuration Interface STCI for controlling and observing modules through a scan chain; a scan-in pin for loading a prepared set of test vectors; a scan-out pin associated with the STCI for outputting all status bits, wherein a burn-in mode is provided on the STCI and is selectable during testing for configuring the scan chain, such that said scan chain contains only those status bits required for monitoring burn-in, plus a number of bits necessary for controlling overall behaviour of the scan chain, and wherein the scan-out pin will show a one if there is a fault. Preferably, the scan chain contains the minimum number of control bits necessary for controlling overall behaviour of the scan chain.

According to a second aspect of the invention there is provided a burn-in monitoring method for testing modules on an Integrated Circuit (IC), comprising the steps of: providing a burn-in mode for configuring a scan chain, assembled by a Serial Test and Configuration Interface STCI for controlling and observing modules through the scan chain, such that the scan chain contains only those status bits required for monitoring burn-in, plus a number of bits necessary for controlling overall behaviour of the scan chain; capturing the status bits required for monitoring burn-in, plus a number of bits necessary for controlling overall behaviour of the scan chain so that the scan elements associated with the control bits will be loaded with zero; and scanning out all status bits, wherein all bits will be zero unless there is a fault in which case one of the status bits will have been set to one. Preferably, the scan chain contains the minimum number of control bits necessary for controlling overall behaviour of the scan chain.

Specific embodiments of the invention will now be described, by way of example only, with reference to the accompanying drawings, in which:

DESCRIPTION OF THE DRAWINGS

FIG. 1 shows a graph of the STCI timing in accordance with a preferred embodiment of the present invention.

DETAILED DESCRIPTION OF SPECIFIC EMBODIMENTS OF THE INVENTION

Within Application Specific Integrated Chips (ASIC), complex IP modules such as Serializers/Deserializers (SerDes) utilise a serial test and configuration interface (STCI) to facilitate modular, extensible, low cost production test. This simple serial interface allows IP modules to be controlled and observed by daisy chaining them on a single scan chain. All stimulus for all IP modules is applied through a single scan-in pin, and all status from all IP modules is observed through a single scan-out pin. However, although the status of every IP module can be observed via the scan-out pin, it is not currently possible to use it as a burn-in monitor, because the status information to be monitored is embedded in the scan chain. The monitor pin is required to stay in a certain state unless there is a fault. Because the scan out pin conveys a mixture of control and status information, it does not behave in this manner.

The STCI already makes provision for reconfiguring the scan chain to contain different elements according to the values scanned into certain elements on the chain. In a preferred embodiment of the present invention, an additional mode, a burn-in mode, is added which configures the scan chain such that it contains only those status bits required for monitoring, plus the minimum number (3 or 4) of control bits necessary to control overall behaviour of the scan chain. Furthermore, in this mode when capturing the status bits into the scan chain, the scan elements associated with the control bits will also be loaded with zero. In this way, all bits scanned out will be zero, unless there is fault in which case one of the status bits will have been set to one.

In this way, the scan-out pin can be reconfigured as a burn-in monitor without the need for any additional gates or control logic outside the complex IP modules. The additional logic required inside the STCI capable complex IP modules is minimal (just a few gates).

The STCI is a low pin count, scan based interface which provides control and observability of the macro for manufacturing test, system diagnostic test and debug. It can also be used to configure the macro. The STCI uses just five signals as shown in Table 1.

TABLE 1

| Port Name | Type | Description |
| --- | --- | --- |
| STCICFG [1:0] | Core Input | STCI Mode. Controls the mode of operation of the serial test interface (reset, shift or update). |
| STCICLK | Core Input | STCI clock. All serial test and configuration interface operations are synchronous to the rising edge of this clock, apart from reset (STCICFG[1] = 0) which is asynchronous. |
| STCID | Core Input | STCI input data. Input data for serial test and configuration interface. |
| STCIQ | Core Output | STCI output data. Output data from serial test and configuration interface. |

The interface state is controlled via STCICFGi[1:0], as shown in Table 2. Any number of STCI compliant macros can be accessed using the same five pins, by connecting STCICLK and STCICFG[1:0] to all of them in parallel whilst connecting the STCIQ output from one to the STCID input of the next.

TABLE 2

STCICFGi91:0] Description.

| Value | Effect |
|---|---|
| 0x | Reset. The interface is reset. The macro is under the control of inputs from the ASIC core, and there is one scan element between STCID and STCIQ. |
| 10 | Shift. Data is shifted into STCID and out of STCIQ using the rising edge of STCICLK. |
| 11 | Update/Capture. The scan chain contents are loaded into the macro, and observe state is loaded into the scan chain, using the rising edge of STCICLK. |

FIG. 1 shows the interface timing, which applies only when STCICFG[1] is driven high, otherwise the interface is held in a reset state in which STCICLK, STCICFG[0] and STCID are ignored and STCIQ is low. Timing parameters shown on FIG. 1 are listed in Table 3 below.

TABLE 3

STCI Timing Summary

| | Parameter | Min | Nom | Max | Units |
|---|---|---|---|---|---|
| $t_{71}$ | STCICLK period | 8 | | | ns |
| $t_{72}$ | Setup, STCICFG, STCID before STCICLK ↑ | 1 | | | ns |
| $t_{73}$ | Hold, STCICFG, STCID after STCICLK ↑ | 0.5 | | | ns |
| $t_{74}$ | Delay, STCICLK ↑ to STCIQ valid | | | 2 | ns |

Data shifted into the macro when STCICFG=10 has no affect on the macro until an update/capture (rising edge of STCICLK when STCICFG=11). This allows the macro to operate normally during scans. Note that there is no "idle" state selectable via STCICFG. When neither shift nor capture/update are desired, STCICLK must be stopped.

The serial test interface can be configured for several modes, using fields in the scan chain. These modes are described in detail below. The mode selected determines which elements are included in the scan chain, and how they function.

Table 4 summarises the different modes selectable for the serial test interface via the STCIMODE field.

TABLE 4

STCI Mode Selection
STCIMODE

| Value | Effect |
|---|---|
| 000 | Observe. The current state of the macro can be captured, but its configuration is still directly controlled from ports (CFGPLL etc.) and cannot be altered via STCI. |
| 001 | Burn-in. Allows STCIQ to be used as a monitor pin during burn-in testing. |
| 010 | Control. The macro can be configured and observed from STCI. All configuration inputs can be overridden, and all status outputs observed. Some additional capabilities to facilitate manufacturing test and system diagnostics are also provided. |
| 011 | Debug. As per 010, but provides additional control and observation points for debug purposes. |
| 100 | Stuck-at Fault ATPG. Provides control of macro outputs, and observe of macro inputs, to facilitate stuck-at fault ATPG testing of the interface between the macro and the ASIC core using ATPG tools. The macro is automatically placed in a low power state suitable for IDDQ testing. |

TABLE 4-continued

STCI Mode Selection
STCIMODE

| Value | Effect |
|---|---|
| 101 | Transition Fault ATPG. Provides control and observe of macro |
| 110 | outputs and inputs that operate synchronous to the bus clocks |
| 111 | (TXBCLKIN and RXBCLKIN), with a choice of two, three or four at-speed execute pulses (settings 101, 110 or 111 respectively) generated using the internal PLL. |

Setting STCIMODE to 001 selects burn-in mode. During burn-in, macros are first configured for internal loopback with pattern generation and verification enabled using control mode (see next section), in order to maximize the number of nodes toggling. It is highly desireable that an external monitor is provided, so that if a macro fails, it can be detected without having to wait until the next 'read point'.

This mode configures the scan chain so that STCIQ will always be low during a shift after an update/capture as long as no pattern verification errors have been detected. To achieve this, the number of elements in the scan chain is reduced to the minimum required (UNBYPASS, STCIMODE and the TESTFAILi bits). On an update/capture, they behave as follows:
  TESTFAILi is captured into scan chain, and cleared if INVPAIRi=1;
  UNBYPASS and STCIMODE are loaded into the macro;
  UNBYPASS and STCIMODE scan elements capture zeros.

A typical sequence using this mode would be:
  Use control mode to set up the macro for PRBS loopback;
  Shift 001 into STCIMODE, and update;
  Shift out the captured state.
  Repeat the two items above.

Clearing the TESTFAILi sticky bit conditionally based on INVPAIRi, provides two alternative behaviours. When INVPAIRi=1, scanning out a 1 from TESTFAILi indicates an error since the last scan, whereas when INVPAIRi=0 scanning out a 1 indicates an error at any time since since burn-in mode was selected, regardless of how many scans have been performed.

Note that the macro operating behaviour is determined by the scan elements accessible from control mode, even though these scan elements are not accessible in burn-in mode. Update/capture in burn-in mode will not affect the state of any scan elements that are excluded from the scan chain.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. A burn-in monitor for testing modules on an Integrated Circuits(IC), comprising:
  a Serial Test and Configuration Interface STCI for controlling and observing modules through a scan chain;
  a scan-in pin for loading a prepared set of test vectors;
  a scan-out pin associated with the STCI for outputting all status bits, wherein a burn-in mode is provided on the STCI and is selectable during testing for configuring the scan chain, such that said scan chain contains only those status bits required for monitoring burn-in, plus a number of bits necessary for controlling overall behaviour of the scan chain, and wherein the scan-out pin will show a one if there is a fault.

2. A burn-in monitor as claimed in claim 1, wherein the scan chain contains the minimum number of control bits necessary for controlling overall behaviour of the scan chain.

3. A burn-in monitoring method for testing modules on an Integrated Circuit (IC), comprising the steps:

provide a burn-in mode for configuring a scan chain, assembled by a Serial Test and Configuration Interface STCI for controlling and observing modules through the scan chain, such that the scan chain contains only those status bits required for monitoring burn-in, plus a number of bits necessary for controlling overall behaviour of the scan chain;

capturing the status bits required for monitoring burn-in, plus a number of bits necessary for controlling overall behaviour of the scan chain so that the scan elements associated with the control bits will be loaded with zero; and scanning out all status bits, wherein all bits will be zero unless there is a fault in which case one of the status bits will have been set to one.

4. A method as claimed in claim 3, wherein the scan chain contains the minimum number of control bits necessary for controlling overall behaviour of the scan chain.

* * * * *